United States Patent
Kitayama et al.

(10) Patent No.: US 9,300,250 B2
(45) Date of Patent: Mar. 29, 2016

(54) SIGNAL LEVEL ADJUSTING DEVICE AND HIGH-FREQUENCY APPARATUS

(71) Applicant: NIHON DEMPA KOGYO CO., LTD., Tokyo (JP)

(72) Inventors: Yasuo Kitayama, Saitama (JP); Hiroyuki Demura, Saitama (JP); Naoki Onishi, Saitama (JP)

(73) Assignee: NIHON DEMPA KOGYO CO., LTD., Tokyo (JP)

(*) Notice: Subject to any disclaimer, the term of this patent is extended or adjusted under 35 U.S.C. 154(b) by 318 days.

(21) Appl. No.: 14/082,700

(22) Filed: Nov. 18, 2013

(65) Prior Publication Data

US 2014/0077844 A1 Mar. 20, 2014

Related U.S. Application Data

(62) Division of application No. 13/200,024, filed on Sep. 15, 2011, now Pat. No. 8,633,735.

(30) Foreign Application Priority Data

Oct. 27, 2010 (JP) ................ 2010-241335
May 27, 2011 (JP) ................ 2011-119610

(51) Int. Cl.
*H03B 21/00* (2006.01)
*H03G 1/00* (2006.01)
*H03G 3/30* (2006.01)
*H03L 5/00* (2006.01)

(52) U.S. Cl.
CPC ............ *H03B 21/00* (2013.01); *H03G 1/0058* (2013.01); *H03G 3/30* (2013.01); *H03L 5/00* (2013.01)

(58) Field of Classification Search
CPC ..................................... H03L 5/00
See application file for complete search history.

(56) References Cited

U.S. PATENT DOCUMENTS

| | | | |
|---|---|---|---|
| 8,208,872 B2 | 6/2012 | Wang | |
| 8,633,735 B2* | 1/2014 | Kitayama | H03G 1/0058 327/105 |
| 8,633,754 B2* | 1/2014 | Granger-Jones | H03H 11/245 327/308 |

FOREIGN PATENT DOCUMENTS

JP 7-307631 11/1995

\* cited by examiner

*Primary Examiner* — Hai L Nguyen
(74) *Attorney, Agent, or Firm* — Jordan and Hamburg LLP

(57) ABSTRACT

To provide, in a frequency synthesizer including: a variable attenuator provided at a subsequent stage of a voltage controlled oscillator; a detector; and a control unit outputting a control voltage for adjusting an attenuation amount of the variable attenuator via a digital/analog converter in accordance with a detection voltage, a technology with which a spurious due to a change in an output of the digital/analog converter can be suppressed. A low-pass filter is provided between an output side of a digital/analog converter and a variable attenuator to cut a frequency component corresponding to an overshoot generated when an output of the digital/analog converter is changed. Further, a period of time from when a control unit outputs a control voltage to when it reads a signal level detected by a detector is set to a period of time longer than a time constant of the low-pass filter determined by a cut-off frequency of the low-pass filter so that no influence is exerted on an operation of automatically controlling the signal level.

2 Claims, 13 Drawing Sheets

(a)

(b)

(a)

(b)

PRIOR ART

PRIOR ART

SIGNAL LEVEL ADJUSTING DEVICE AND HIGH-FREQUENCY APPARATUS

This is a Divisional of U.S. Ser. No. 13/200,024 filed Sep. 14, 2011.

BACKGROUND OF THE INVENTION

1. Field of the Invention

The present invention relates to a technical field in which an output signal level of a frequency synthesizer, for example, is automatically adjusted by a variable attenuator.

2. Description of the Related Art

Generally, in a high-frequency apparatus, in order to make a signal level (amplitude value) of high-frequency signal constant, an APC (Auto Power Control) is performed in which a variable attenuator is provided in a high-frequency signal path and a control voltage of the variable attenuator is controlled based on a signal level obtained by a detector on an output side (at a subsequent stage) of the variable attenuator.

FIG. 10 is a circuit of a frequency synthesizer in which an APC function is incorporated. 1 denotes a PLL integrated circuit unit (PLL-IC) in which PLL (Phase Locked Loop) circuits are integrated. The PLL integrated circuit unit 1 operates to synchronize, based on a control signal from a control unit 3, a reference clock from a reference clock generating unit 11 and a frequency signal output from a voltage controlled oscillator 2 to make the high-frequency signal have a set frequency set by the control unit 3, and explanation regarding a concrete example thereof will be omitted here since it is overlapped with explanation of later-described embodiments.

A phase difference signal, for example, obtained by the PLL integrated circuit unit 1 is integrated by a loop filter 22, and a value of the integrated signal is input into the voltage controlled oscillator 2. At a subsequent stage of the voltage controlled oscillator 2, an amplifier 22, a variable attenuator 4, an amplifier 41 and a band-pass filter 42 are provided, and accordingly, the frequency signal is amplified to a predetermined signal level (amplitude value) to be an output of the frequency synthesizer. In FIG. 10, a part in which the frequency signal is set to have the predetermined frequency is indicated as an oscillation stage 100, and further, a part in which the frequency signal is amplified to the predetermined level is indicated as a variable amplification stage 200.

The output of the frequency synthesizer has to constantly keep a desired level as a reference signal of frequency, so that there is a need to constantly comply with an ambient temperature, aging of amplifier and the like.

A function to deal with the requirement is the APC function. Specifically, the control unit 3 grasps a current signal level of frequency signal based on a detection voltage (voltage detection value) detected by the detector 5, and when the signal level is deviated from a predetermined signal level, namely, when the detection voltage is deviated from a set voltage, the control unit 3 changes a control voltage of the variable attenuator 4 via a D/A (digital analog) converter 6 to adjust an attenuation amount of the frequency signal. When the attenuation amount of the variable attenuator 4 is changed, the detection voltage of the detector 5 is also changed, and the control unit 3 judges whether or not it changes the control voltage based on the detection voltage. As above, the signal level of frequency signal is set to be constant by a loop of the detector 5, the control unit 3, the D/A converter 6, the variable attenuator 4 and the detector 5.

A characteristic of the detection voltage with respect to the signal level (output level) is monotone increasing as shown in FIG. 11(a) or monotone decreasing as shown in FIG. 11(b), and when a desired output level is P1, the control unit 3 adjusts the attenuation amount of the variable attenuator 4 so that the detection voltage becomes V1. When the characteristic is monotone increasing shown in FIG. 11(a), if the detection voltage is higher than V1, the control unit 3 increases the control voltage of the variable attenuator 4 so that the output level is lowered, namely, the attenuation amount is increased, and if the detection voltage is lower than V1, the control unit 3 decreases the control voltage. Note that when the characteristic is monotone decreasing shown in FIG. 11(b), the changing operation of increasing/decreasing the control voltage by the control unit 3 is conducted in an opposite manner to the case of monotone increasing.

However, the aforementioned frequency synthesizer has a problem as follows. In the D/A converter 6, a pulse-like voltage change momentarily occurs, so that more than a little overshoot is generated on a rising edge and a falling edge. This state is schematically shown in FIG. 12. If an analog output of the D/A converter 6 is applied to the variable attenuator 4 under this state, a frequency component of the overshoot is directly superimposed on a high-frequency signal line, and in an output of the frequency synthesizer, a component corresponding to the frequency component appears as spurious at a detuned point, which results in deterioration in radio characteristics. FIG. 13 shows a result of examining a relation between a offset frequency and a signal strength (power strength) regarding the pulse-like changed portion in the D/A converter 6. A floor noise at a frequency detuned by 10 Hz or more (at a frequency of 10 Hz or more) is about equal to −80 dB, but, at a frequency of 20 kHz, the signal strength is about −30 dB, and this phenomenon is caused by an influence of overshoot.

FIG. 14 shows a spectrum waveform of an output of a frequency synthesizer, in which although a floor noise at a frequency detuned by 10 Hz or more is hidden and cannot be seen, at a position detuned by 20 kHz from a set frequency, the spurious shown in FIG. 13 directly appears. There is a case where the position of spurious differs depending on systems, and the spurious does not exert an influence on the system. However, in a frequency synthesizer used in an OFD system for terrestrial digital broadcasting with 64QAM modulation, for example, disturbance of image and sound occurs due to the spurious.

Although Patent Document 1 describes a technology in which weighting processing is performed on an output of a voltage controlled attenuator to create a control voltage and the control voltage is supplied to the voltage controlled attenuator via a D/A converter, it does not disclose a method for solving the above-described problem.

[Patent Document 1] Japanese Patent Application Laid-open No. H7-307631 (FIG. 2 and Claim 1)

SUMMARY OF THE INVENTION

The present invention has been made under such a background, and an object thereof is to provide a signal level adjusting device detecting a signal level on an output side of a variable attenuator provided in a signal path of frequency signal to output a control voltage for adjusting an attenuation amount of the variable attenuator in accordance with a detection voltage, and capable of suppressing a spurious in the output of the variable attenuator. An another object of the present invention is to suppress a spurious in an output of a high-frequency apparatus by composing the high-frequency apparatus using the signal level adjusting device.

The present invention is a signal level adjusting device characterized in that it includes: a variable attenuator provided in a signal path of frequency signal and in which an attenuation amount of the frequency signal is adjusted by a control voltage; a detector detecting a signal level of frequency signal on an output side of the variable attenuator; a control unit outputting a command value being a digital signal corresponding to the control voltage based on the signal level detected by the detector; a digital/analog converter converting the command value into an analog voltage to output the resultant as the control voltage; and a low-pass filter provided between an output side of the digital/analog converter and the variable attenuator, in which a period of time from when the control unit outputs the control voltage to when it reads the signal level detected by the detector is set to a period of time longer than a time constant of the low-pass filter determined by a cut-off frequency of the low-pass filter.

It is possible to provide a structure in which the control unit includes: a function to add, to the control voltage which is set based on the signal level detected one time before, a differential voltage corresponding to a difference between the detected signal level and a target signal level, to turn the control voltage into a new control voltage; and a function to limit, when the differential voltage is deviated from a previously set limit value, the differential voltage to the limit value.

An another invention is a signal level adjusting device characterized in that it includes: a variable attenuator provided in a signal path of frequency signal and in which an attenuation amount of the frequency signal is adjusted by a control voltage; a detector detecting a signal level of frequency signal on an output side of the variable attenuator; a comparator in which a detection voltage detected by the detector and a target voltage corresponding to a target signal level are input and compared, and approximating the detection voltage to the target voltage; an integration circuit unit integrating an output of the comparator to set the integrated output to the control voltage; and a low-pass filter provided between the comparator and the integration circuit unit.

A still another invention is a frequency synthesizer outputting a frequency signal being an oscillation output of a voltage controlled oscillator via an amplifier, the frequency synthesizer being characterized in that it includes the signal level adjusting device of the present invention including the variable attenuator provided in the signal path of the frequency signal.

The present invention provides, in the signal level adjusting device in which the signal level on the output side of the variable attenuator provided in the signal path of the frequency signal is detected, and the control voltage for adjusting the attenuation amount of the variable attenuator is output, in accordance with the detection voltage, from the control unit via the digital/analog converter, to make the signal level of the output of the variable attenuator constant, the low-pass filter between the output side of the digital/analog converter and the variable attenuator, to thereby cut a frequency component corresponding to an overshoot generated when the output of the digital/analog converter is changed. Further, the control voltage is designed to be output from the control unit at a time interval longer than the time constant of the low-pass filter determined by the cut-off frequency of the low-pass filter so that no influence is exerted on a control operation. Accordingly, it is possible to suppress a spurious due to the change in the output of the digital/analog converter.

The another invention uses, in the signal level adjusting device in which the signal level on the output side of the variable attenuator provided in the signal path of the frequency signal is detected to output the control voltage for adjusting the attenuation amount of the variable attenuator in accordance with the detection voltage, the comparator without using the D/A converter, and it provides the low-pass filter on the output side of the comparator to generate the control voltage, which provides an effect that the spurious in the output of the variable attenuator can be suppressed.

Further, if such a signal level adjusting device is applied to the high-frequency apparatus such as the frequency synthesizer, for example, it is possible to avoid an adverse effect due to the spurious.

DETAILED DESCRIPTION OF THE PREFERRED EMBODIMENT(S)

First Embodiment

Figure 1:
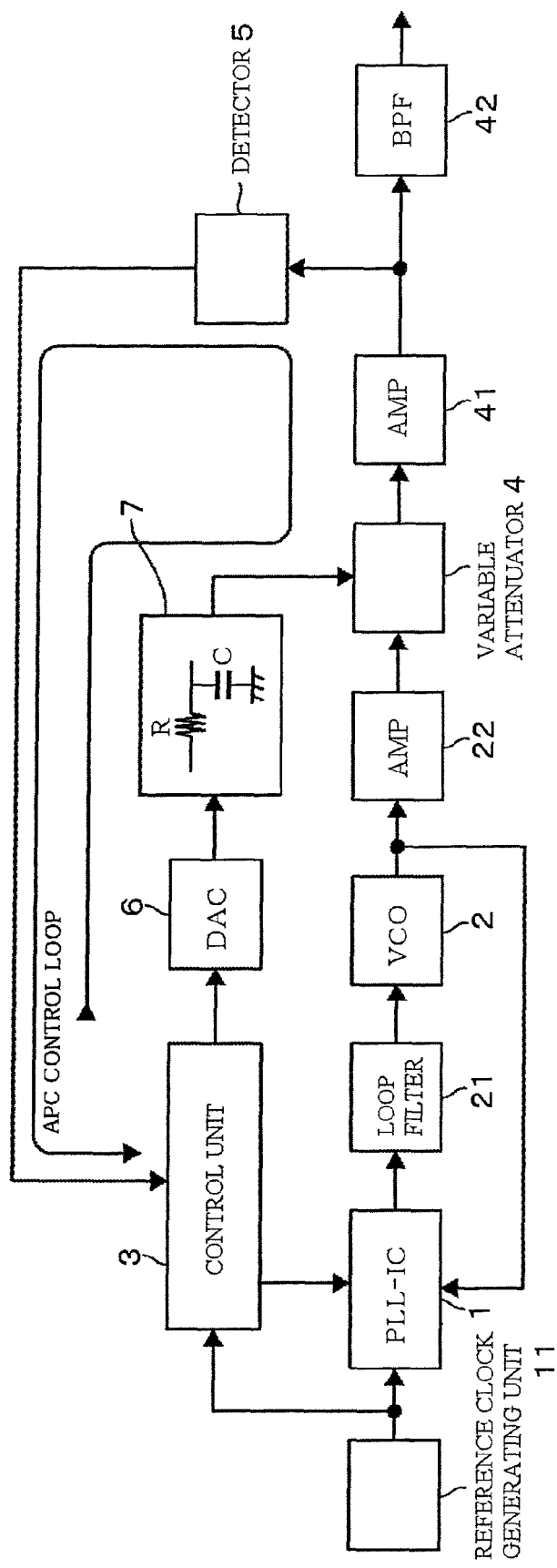
FIG. 1 is a block diagram showing a first embodiment of a frequency synthesizer of the present invention.
Figure 10:
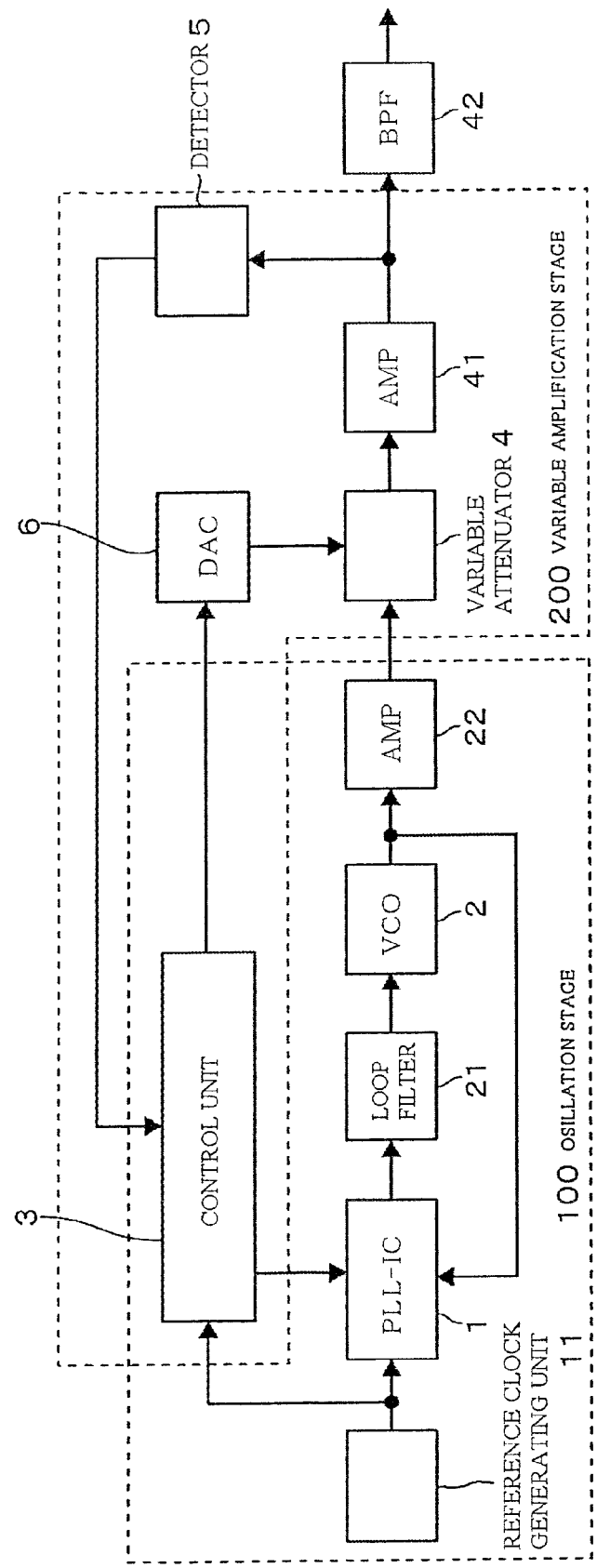
FIG. 10 is a block diagram showing a conventional frequency synthesizer.

FIG. 1 is a block, diagram showing a first embodiment of a frequency synthesizer according to the present invention. This embodiment is different from FIG. 10 that shows a conventional frequency synthesizer in that (1) a low-pass filter 7 is provided between an output side of the digital/analog converter and the variable attenuator 4, and (2) a function of the control unit 3 is different. First, explanation regarding an example of the PLL integrated circuit unit 1, which was not described in the explanation in FIG. 10, will be made. For example, the PLL integrated circuit unit 1 includes: a frequency dividing part dividing a frequency of an output of the voltage controlled oscillator 2; an VD converting part provided at a subsequent stage of the frequency dividing part; a part performing quadrature detection of an output of the A/D converting part using a reference clock and extracting a rotation vector K which rotates at a frequency equal to a difference between both frequencies; and a part outputting, to a loop filter 2, a rotation vector K0 which rotates at a set frequency in accordance with a set output frequency of the frequency synthesizer and a signal corresponding to a velocity difference of the rotation vectors K and K0. In this case, a PLL loop is locked when the velocity of the rotation vector K coincides with the velocity of the rotation vector K0, but, a structure of the PLL integrated circuit unit 1 is not limited to such a structure, and the unit may also be structured such that a frequency dividing part dividing a frequency of an output signal of the voltage controlled oscillator 2 is provided, and a signal in accordance with a phase difference between a phase of the frequency-divided output signal and a phase of the reference clock is extracted to be output to a loop filter.

Figure 2:
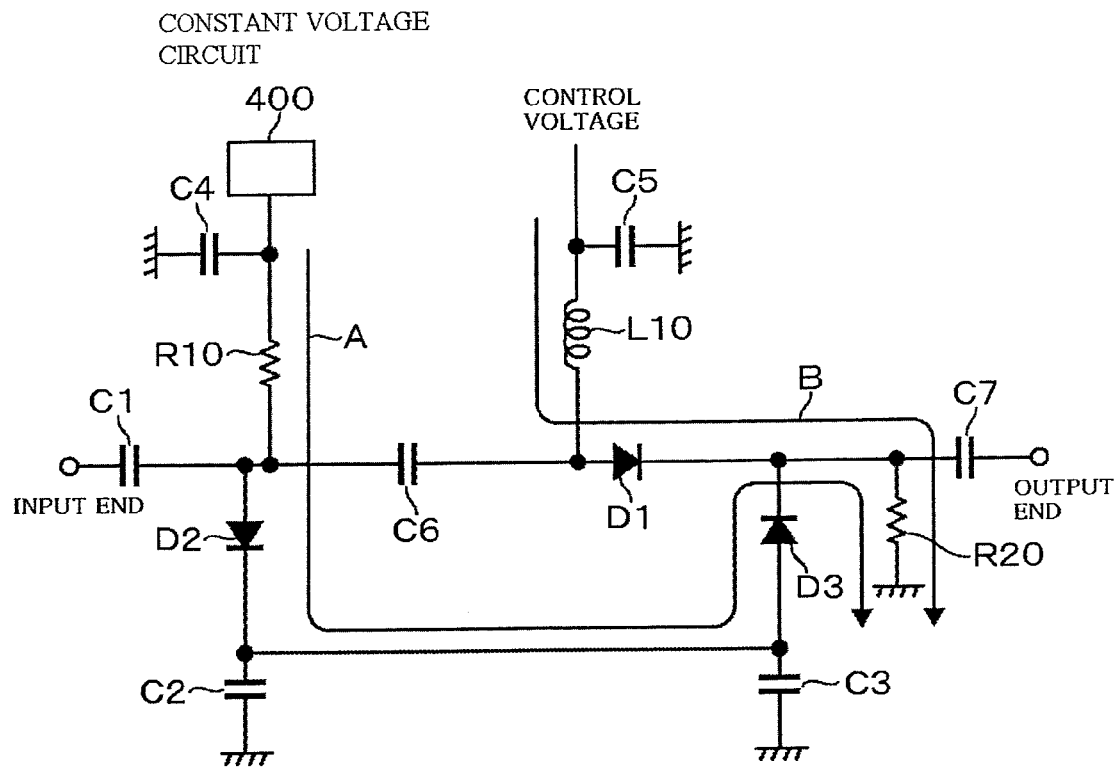
FIG. 2 is a circuit diagram showing an example of a variable attenuator.

Next, a well-known structural example of the variable attenuator 4 in which PIN diodes are π-connected, will be described in FIG. 2. As indicated by a path of solid line A, a current flows, from a constant voltage circuit 400, through a path that passes through a resistor R10, a PIN diode D2, a PIN diode D3, a resistor R20 and a ground, and as indicated by a path of solid line B, a control voltage (control voltage output from the control unit 3 via the digital/analog converter 6) flows through a path that passes through an inductance L10, a PIN diode D1, the resistor R20 and the ground. C1 to C7 are capacitors.

In this circuit, by decreasing the control voltage, an attenuation amount becomes large. Specifically, by decreasing the control voltage, a forward current of the PIN diode D1 is decreased and a forward resistance value of the PIN diode D1 becomes large. Accordingly, an amount of voltage drop of the resistor R20 becomes small, resulting in that the current flowing through the path indicated by the solid line B is increased. Therefore, forward currents of the PIN diodes D2, D3 are increased, and forward resistance values of the PIN diodes D2, D3 become small.

Figure 3:
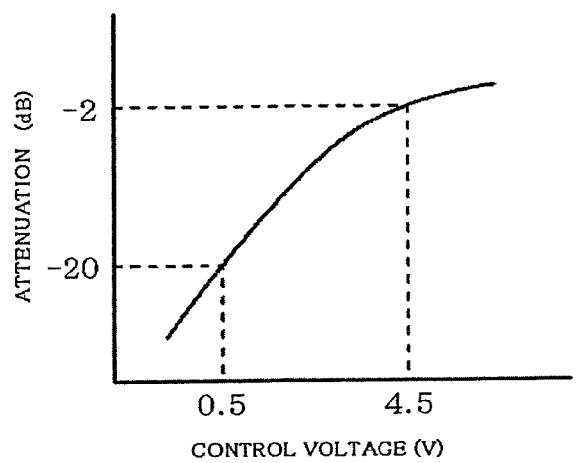
FIG. 3 is a characteristic chart showing a characteristic of the variable attenuator.

Further, conversely, by increasing the control voltage of the voltage controlled oscillator 2, the attenuation amount becomes small. Specifically, by increasing the control voltage, the forward current of the PIN diode D1 is increased and the forward resistance value of the PIN diode D1 becomes small. Accordingly, the amount of voltage drop of the resistor R20 becomes large, resulting in that the current flowing through the path indicated by the solid line B is decreased. Therefore, the forward currents of the PIN diodes D2, D3 are decreased, and the forward resistance values of the PIN diodes D2, D3 become large. FIG. 3 shows an example of attenuation characteristics of the variable attenuator.

In a frequency synthesizer used in an OFD system for terrestrial digital broadcasting with 64QAM modulation, there is a small influence on a demodulation circuit at a frequency detuned by 10 Hz or less in the vicinity of carrier, and a noise (including spurious) at a frequency greater than 10 Hz becomes an implementation loss, so that there is a need to set a cut-off frequency of the low-pass filter 7 to 10 Hz or less. Further, the cut-off frequency of the low-pass filter 7 shown in FIG. 1 is represented by $1/(2\pi \cdot \text{resistance value} \cdot \text{capacitance value})$. Note that the resistance value and the capacitance value are a resistance value of resistor R and a capacitance value of capacitor C of the low-pass filter 7, respectively. For example, if C is set to 2.2 μF and R is set to 8.2 kΩ, the cut-off frequency becomes 8.82 Hz.

When the cut-off frequency becomes low, the time constant cannot be neglected, and an APC response time has to be taken into consideration. When the cut-off frequency is 8.82 Hz, the time constant is 18.04 msec, so that there is a need to set the APC response time to a period of time longer than 18.04 msec. Specifically, a period of time from when the control unit 3 outputs the control voltage to when it reads the signal level detected by the detector 5, is required to be set to a period of time longer than the time constant of the low-pass filter 7 determined by the cut-off frequency of the low-pass filter 7. In this example, the period of time is set to, for example, 30 msec with a margin.

The control unit 3 executes processing to set the control voltage of the variable attenuator 4 based on the detection voltage (voltage detection value) from the detector 5 and the target voltage value, so that it stores parameters such as the target voltage value, and an upper limit value and a lower limit value of digital value of the control voltage of the digital/analog converter 6, and includes a program for performing predetermined calculation and judgment processing and the like required for the APC. These parameters and program will be collectively described in explanation of operation including the following flow chart.

Figure 4:
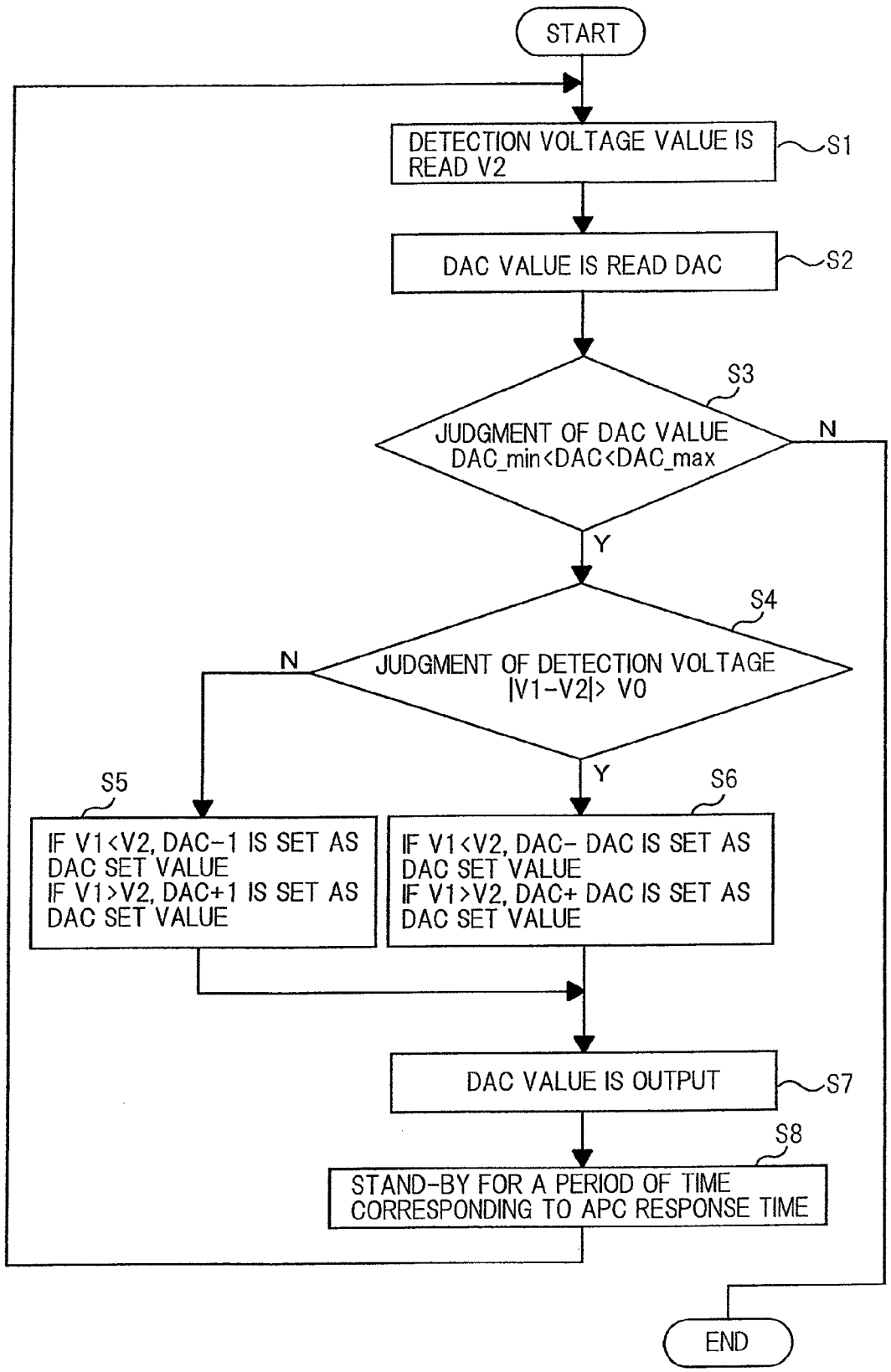
FIG. 4 is a flow chart showing an operation of the aforementioned embodiment.
Figure 11:
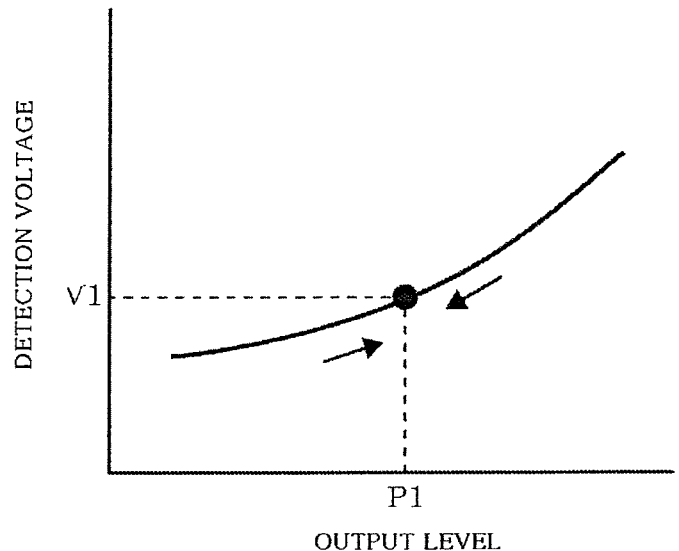
FIGS. 11(a) and 11(b) are characteristic charts each showing a relation between a detection voltage and a signal level of an output of the frequency synthesizer.
Figure 11:
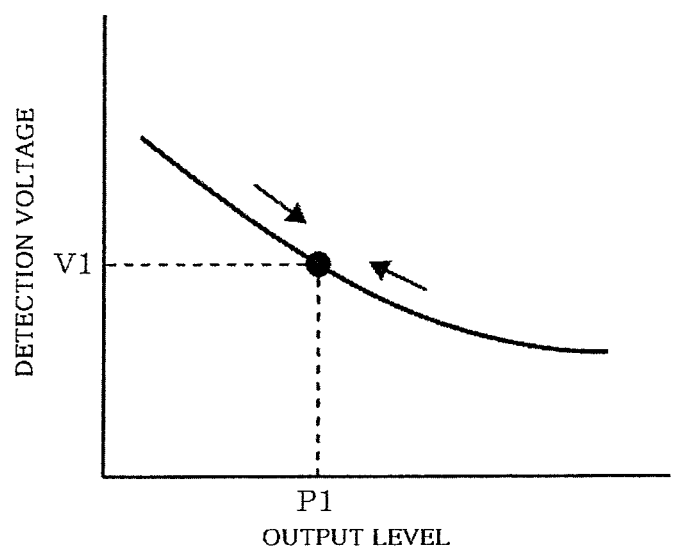

FIG. 4 is a flow chart showing an APC operation in the above-described embodiment. In this example, as the detector 5, one exhibiting the characteristic of monotone increasing shown in FIG. 11(a) is used. The detector 5 detects a frequency signal output from the amplifier 41, and the control unit 3 reads a value V2 of the detected voltage (step S1). Further, the control unit 3 reads a digital value being a set value of the digital/analog converter 6 at this moment (step S2). Hereinafter, this digital value is called as DAC value. The DAC value is a value corresponding to the control voltage of the variable attenuator 4. The control unit 3 outputs the DAC value based on the detection voltage as described above, and the period of time (APC response time) from when the DAC value is output to when the detection voltage is read for calculating the following DAC value is, for example, 30 msec which is longer than the time constant of the low-pass filter 7. Accordingly, as a result of this, an output interval of the DAC value (response time) is 30 msec, and the aforementioned DAC value "at this moment" is a DAC value output in a cycle one cycle before the cycle in which the detection voltage obtained in step S1 is taken.

In a memory in the control unit 3, the upper limit value and the lower limit value of DAC value are previously set, and the control unit 3 judges whether or not the DAC value read in step S2 is between the upper limit value and the lower limit value (step S3), in which if the DAC value is not between the values, the control unit 3 cannot execute the APC, and stops the output of the frequency synthesizer by giving an alarm, for example, as an APC error. If the DAC value falls between the upper limit value and the lower limit value, the control unit 3 determines an absolute value of a difference between the detection voltage V2 and the target voltage V1, and judges whether or not the difference value is greater than a tolerance value (difference threshold value) ΔV0 (step S4).

The target voltage V1 is a voltage value corresponding to a sort of desired value of an output level (signal level of output frequency signal) of the frequency synthesizer, and is set to a voltage value corresponding to a center value of a tolerance range of the output level that meets a specification, for example. Further, the tolerance value ΔV0 is set to a value with which, if the signal level is deviated from the target value, it falls within the tolerance range. The target voltage V1 and the tolerance value ΔV0 are previously set by an operator in the control unit 3 and stored in the memory.

When the absolute value of the difference between the detection voltage V2 and the target voltage V1 is within the tolerance value ΔV0, namely, when the result in the judgment step S4 is "NO", there is no problem if the APC control is kept continued. However, in order to further approximate the signal level to the desired value, namely, in order to further approximate the detection voltage V2 to the target voltage V1, when, as the detector 5, one exhibiting the characteristic of monotone increasing shown in FIG. 11(a) is used, and if the detection voltage V2 is larger than the target voltage V1, a value smaller than the DAC value output in the current cycle by "1" in the digital value, is set as a new DAC value for slightly reducing the output level of the frequency synthesizer (step S5). Further, conversely, if the detection voltage V2 is smaller than the target voltage V1, a value larger than the DAC value output in the current cycle by "1" in the digital value (value larger than the DAC value by an amount corresponding to 1 bit), is set as a new DAC value (step S5).

Figure 5:
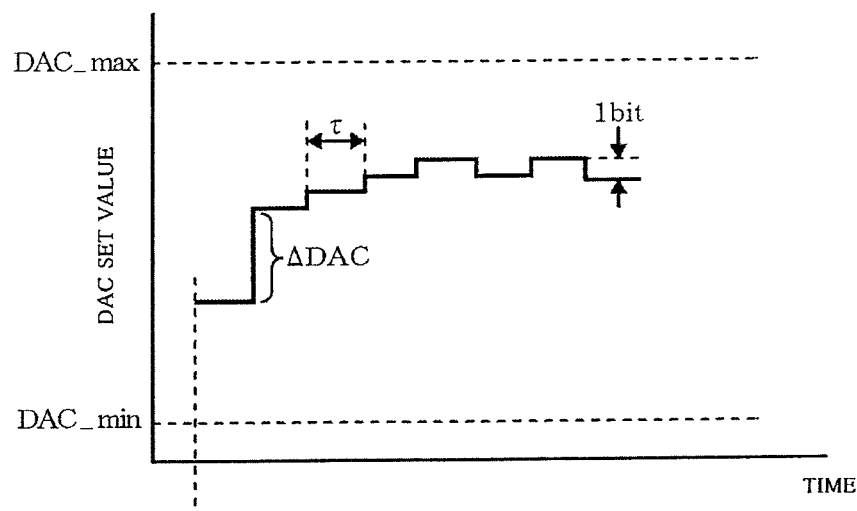
FIGS. 5(a) and 5(b) are characteristic charts showing a relation between a time and a digital value input into a digital/analog converter and a relation between a time and a detection voltage.
Figure 5:
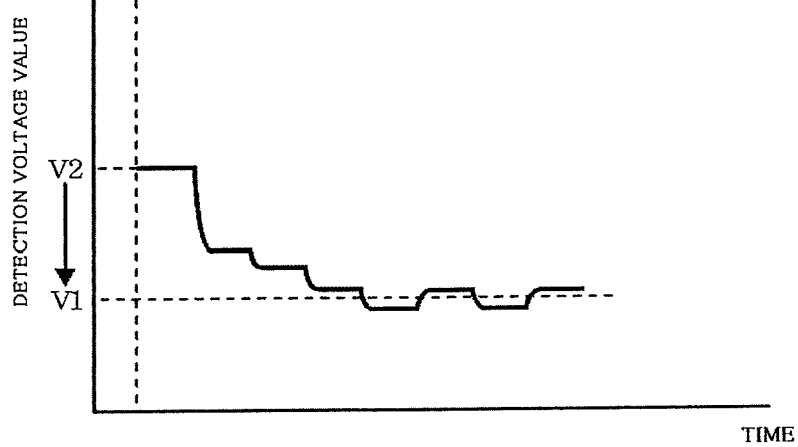

FIG. 5(a) is a characteristic chart in which a DAC value and an elapsed time are taken along a vertical axis and a horizontal axis, respectively, and FIG. 5(b) is a characteristic chart in which a detection voltage and an elapsed time are taken along a vertical axis and a horizontal axis, respectively. Note that FIG. 5 show characteristics when, as the detector 5; one exhibiting the characteristic of monotone decreasing shown in FIG. 11(b) is used. In this example, when the detection voltage is stabilized, namely, when the difference between the detection voltage V2 and the target voltage V1 is within the tolerance value ΔV0, addition and division of 1 bit are alternately performed on the DAC value in a repeated manner. In this case, a DAC value corresponding to the target voltage V1 exists between one DAC value and a DAC value larger than the value by "1", and thus there is no chance that the difference between the detection voltage V2 and the target voltage V1 becomes zero, so that eventually, the DAC value is controlled in a unit of 1 bit.

Meanwhile, when the absolute value of the difference between the detection voltage V2 and the target voltage V1 is greater than the tolerance value ΔV0, namely, when the result in the judgment step S4 is "YES", if the detection voltage V2 is larger than the target voltage V1, a maximum tolerable change width ΔDAC of DAC value is subtracted from the DAC value at that time to set the resultant as a new DAC value (step S6). Since the analog output from the digital/analog converter 6 changes in a pulse-like manner due to the change in the DAC value, the maximum tolerable change width ΔDAC is set to suppress the overshoot caused by the change. Accordingly, it is set such that when the absolute value of the difference between the detection voltage V2 and the target voltage V1 is greater than the tolerance value ΔV0, the DAC value is not changed by an amount corresponding to the difference, but is changed by the maximum tolerable change width ΔDAC which is previously set as a maximum value of change width with which the overshoot may be suppressed. Further, if the detection voltage V2 is smaller than the target voltage V1, the maximum tolerable change width ΔDAC of DAC value is added to the DAC value at that time to set the resultant as a new DAC value (step S6). When the characteristic of detection voltage of the detector 5 is monotone decreasing, a magnitude relation of V1, V2 in steps S5 and S6 becomes opposite.

When the DAC value is set in step S5 or S6 as above, the control unit 3 outputs the DAC value to the digital/analog converter 6 (in step S7). Specifically, the control voltage is output from the control unit 3 to the variable attenuator 4 via the digital/analog converter 6 and the low-pass filter 7. Further, when a period of time corresponding to the time constant of the low-pass filter 7 elapses, the variable attenuator 4 has an attenuation amount corresponding to the control voltage set by the control unit 3, and the frequency signal has a signal level in accordance with the attenuation amount. Meanwhile, the control unit 3 stands by, after outputting the DAC value, for a set response time τ, which is, a period of time corresponding to 30 msec in this example (step S8), returns to step S1 to read the detection voltage V2, and starts the following control loop processing.

Figure 6:
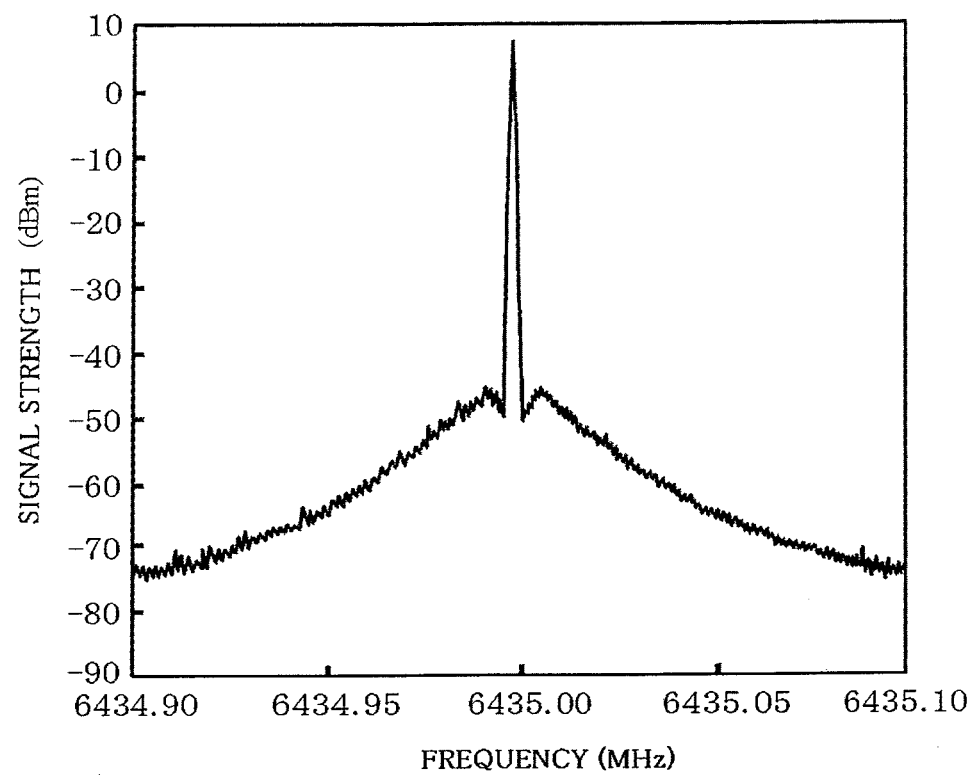
FIG. 6 shows a spectrum of an output of the frequency synthesizer of the present invention.
Figure 12:
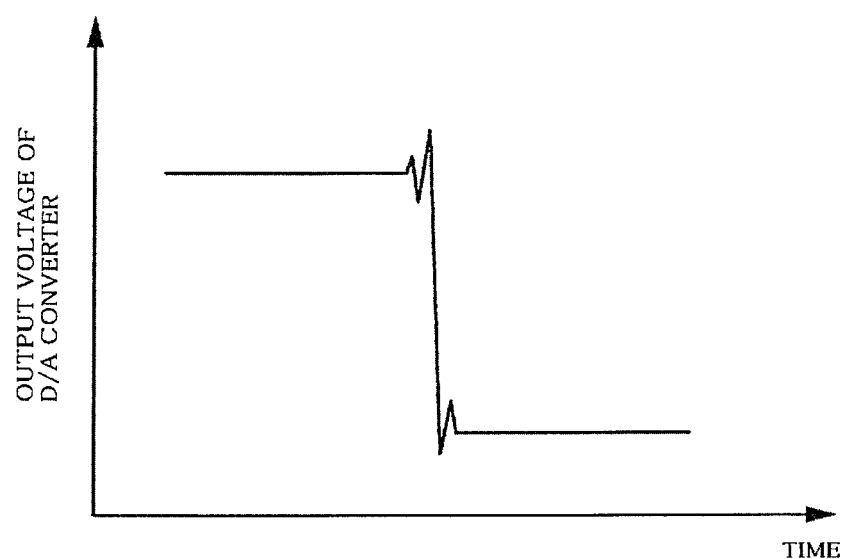
FIG. 12 is a waveform diagram showing a change in an output signal of the digital/analog converter.
Figure 13:
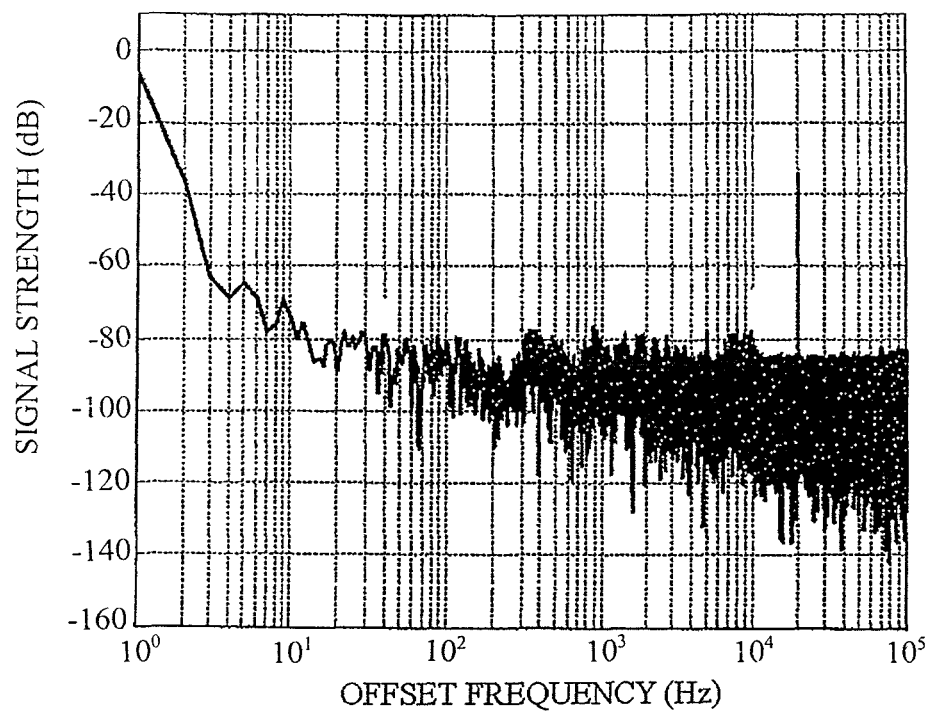
FIG. 13 is a characteristic chart showing a relation between a offset frequency and a signal strength regarding a waveform when the output signal of the digital/analog converter is changed.
Figure 14:
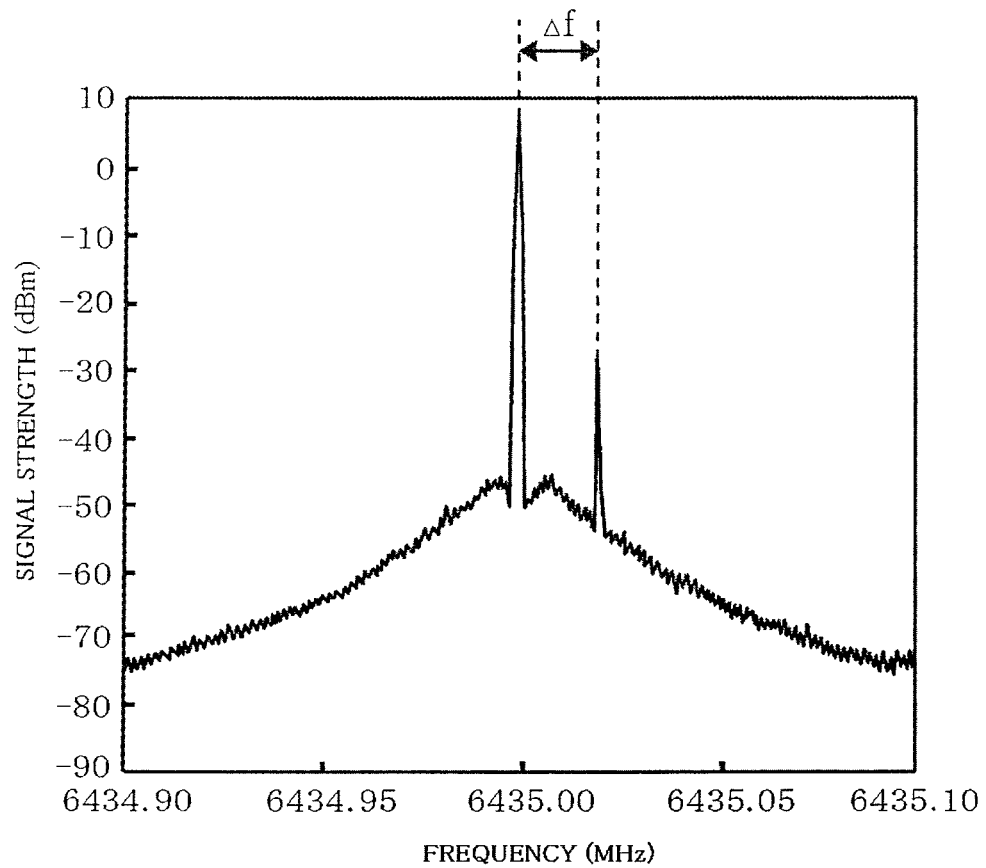
FIG. 14 shows a spectrum of an output of the conventional frequency synthesizer.

In this embodiment, a signal corresponding to a waveform of overshoot generated when the analog voltage output from the digital/analog converter 6 is changed in a pulse-like manner due to the change in the digital value, is removed by the low-pass filter 7. FIG. 6 shows a spectrum of an output of the frequency synthesizer of this embodiment, in which it can be confirmed that the spurious such as one observed in FIG. 12 does not exist. Therefore, it is possible to suppress disturbance of sound and image in terrestrial digital broadcasting, for example.

Hereinafter, a modified example of the aforementioned embodiment will be described.

It is also possible to design such that in the flow chart described in FIG. 4, when the absolute value of the difference between the detection voltage V2 and the target voltage V1 is greater than the tolerance value ΔV0, the DAC value is changed by the difference, on condition that a limiter function is provided so that the amount of change is limited to the maximum tolerable change width ΔDAC.

Figure 7:
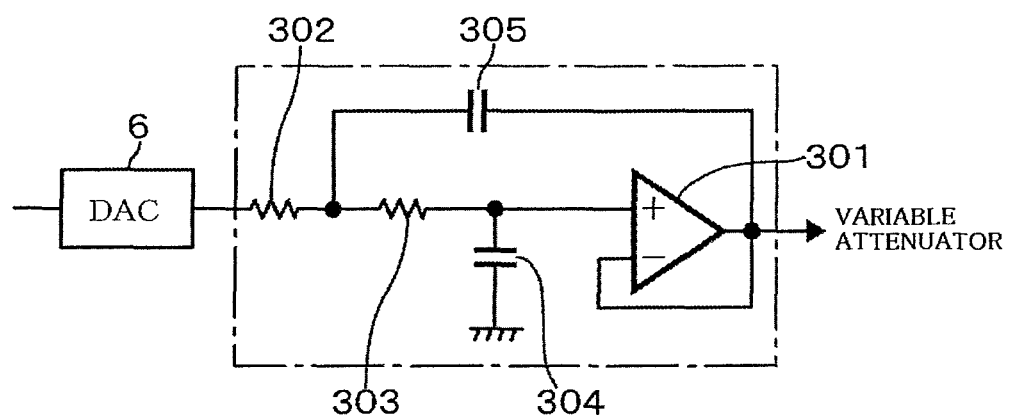
FIG. 7 is a circuit diagram showing an another example of a low-pass filter used in the present invention.

Further, as the low-pass filter 7, one having a structure described in FIG. 7 may also be used. In FIG. 7, 301 denotes an operational amplifier, 302, 303 denote resistors, and 304, 305 denote capacitors. Furthermore, the amplifier 41 and the variable attenuator 4 may also be disposed oppositely, namely, it is also possible that the amplifier 41 is provided at a previous stage of the variable attenuator 4.

Second Embodiment

Figure 8:
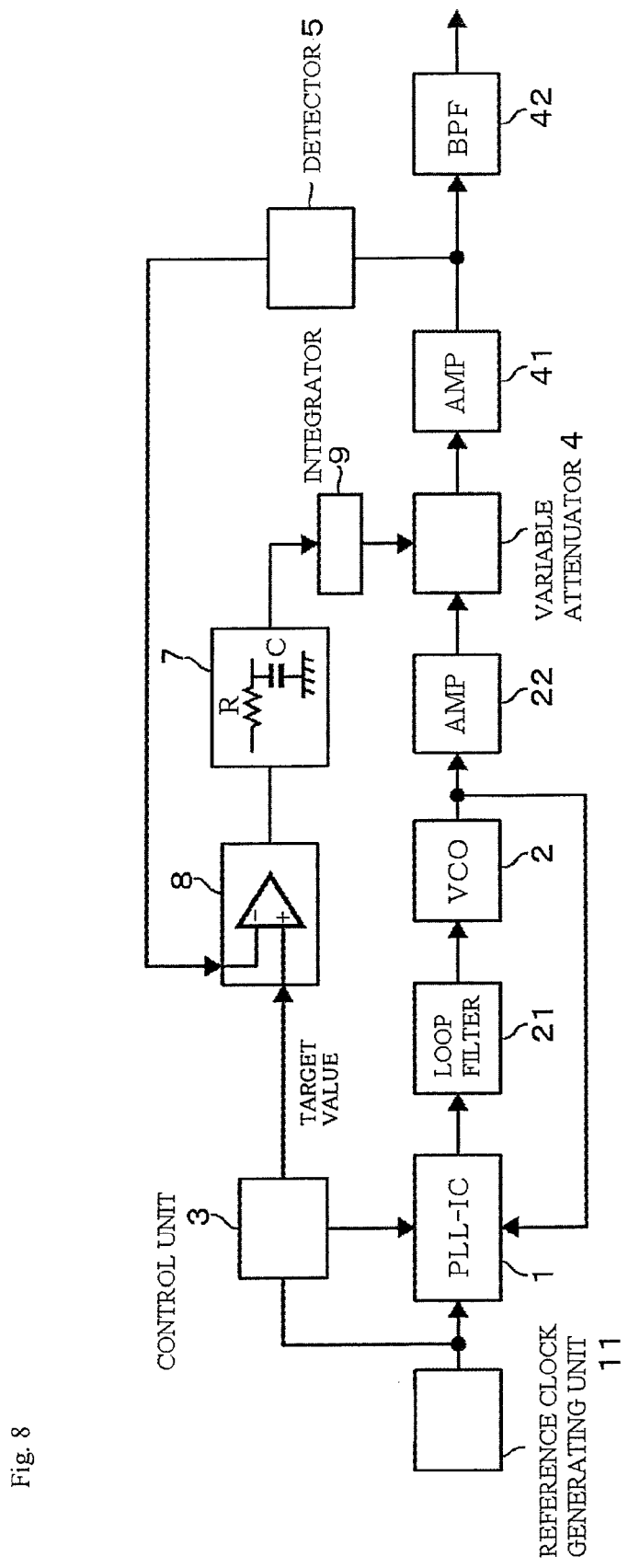
FIG. 8 is a block diagram showing a second embodiment of the frequency synthesizer of the present invention.

FIG. 8 is a block diagram showing a second embodiment of the frequency synthesizer according to the present invention. This embodiment is different from the first embodiment shown in FIG. 1 in that a comparator 8 is used, instead of the DAC 6 that forms the APC control loop. The target value of detection voltage (target voltage) V1 is input from the control unit 3 into an input end on a positive side of the comparator 8, and the detection voltage V2 from the detector 5 is input into an input end on a negative side of the comparator 8. As the detector 5, one exhibiting the characteristic of monotone increasing is used. The target voltage V1 is a voltage value corresponding to a desired value of an output level of the frequency synthesizer. On an output side of the comparator 8, the low-pass filter 7 is provided, and on an output side of the low-pass filter 7, an integrator 9 being an integration circuit unit is provided. The low-pass filter 7 plays a role to cut a frequency component corresponding to an overshoot generated when an output of the comparator 8 is changed. An output voltage of the integrator 9 becomes a control voltage of the variable attenuator 4.

Figure 9:
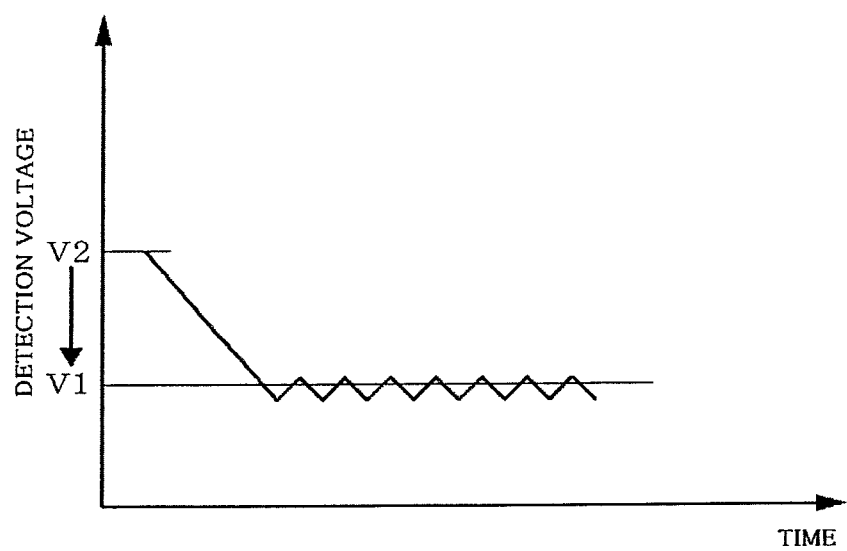
FIG. 9 is a characteristic chart showing a temporal change of detection voltage in the second embodiment.

In the structure as above, when the detector 5 exhibits the characteristic of monotone increasing, and if the detection voltage V2 is larger than the target voltage V1, the output of the comparator 8 becomes "L" level. At this time, an electric charge charged in the integrator 9 is discharged via the comparator 8, and the control voltage of the variable attenuator 4 becomes small, resulting in that an attenuation amount of the variable attenuator 4 becomes large. Further, if the detection voltage V2 is smaller than the target voltage V1, the output of the comparator 8 becomes "H" level. At this time, the output voltage of the comparator 8 is integrated by the integrator 9, and the control voltage of the variable attenuator 4 becomes large, resulting in that the attenuation amount of the variable attenuator 4 becomes small. Therefore, a temporal change of the detection voltage is different from that of the first embodiment, and is represented by a sawtooth form as shown in FIG. 9.

The second embodiment generates, in the signal level adjusting device that detects the signal level on the output side of the variable attenuator 4 to output the control voltage for adjusting the attenuation amount of the variable attenuator 4 in accordance with the detection voltage, the control voltage by using the comparator 8, and since the frequency component corresponding to the overshoot generated when the output of the comparator 8 is changed is cut by the low-pass filter 7, there is provided an effect that the spurious in the output of the high-frequency apparatus which is, for example, the frequency synthesizer, can be suppressed. Further, there is an advantage that the circuitry is simplified since the control voltage is generated by using the comparator 8.

When the detector 5 exhibits the characteristic of monotone decreasing, the inputs into the comparator 8 are performed in an opposite manner to the case of FIG. 8, namely, the target value of detection voltage V1 is input from the control unit 3 into the input end on the negative side, and the detection voltage V2 from the detector 5 is input into the input end on the positive side of the comparator 8. In this case, if the detection voltage V2 is larger than the target voltage V1, the output of the comparator 8 becomes "H" level, and the control voltage of the variable attenuator 4 becomes large, resulting in that the attenuation amount of the variable attenuator 4 becomes small. Further, if the detection voltage V2 is smaller than the target voltage V1, the output of the comparator 8 becomes "L" level. At this time, the control voltage of the variable attenuator 4 becomes small, so that the attenuation amount of the variable attenuator 4 becomes large.

The above-described embodiments describe the system in which the APC with the aforementioned structure is incorporated in the frequency synthesizer, in other words, the frequency synthesizer including the APC, but, the APC with the aforementioned structure separated from the frequency synthesizer is also included in the present invention. As an apparatus to which the APC can be applied, there can be cited a signal generator, a high-frequency transmitter, a high-frequency receiver and the like, other than the frequency synthesizer.

What is claimed is:

1. A signal level adjusting device, comprising: a variable attenuator provided in a signal path of frequency signal and in which an attenuation amount of the frequency signal is adjusted by a control voltage; a detector detecting a signal level of frequency signal on an output side of said variable attenuator; a comparator in which a detection voltage detected by said detector and a target voltage corresponding to a target signal level are input and compared, and approximating the detection voltage to the target voltage; an integration circuit unit integrating an output of said comparator to set the integrated output to the control voltage; and a low-pass filter provided between said comparator and said integration circuit unit.

2. A frequency synthesizer outputting a frequency signal being an oscillation output of a voltage controlled oscillator via an amplifier, the frequency synthesizer comprising said signal level adjusting device according to claim 1 including said variable attenuator provided in the signal path of the frequency signal.

* * * * *